(12) United States Patent
Park et al.

(10) Patent No.: US 9,040,974 B2
(45) Date of Patent: May 26, 2015

(54) ORGANIC LIGHT-EMITTING DISPLAY APPARATUS

(71) Applicant: Samsung Display Co., Ltd., Yongin (KR)

(72) Inventors: Jong-Hyun Park, Yongin (KR); Chun-Gi You, Yongin (KR); Seong-Kweon Heo, Yongin (KR); Kyung-Hoon Park, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 14/079,996

(22) Filed: Nov. 14, 2013

(65) Prior Publication Data

US 2014/0353616 A1 Dec. 4, 2014

(30) Foreign Application Priority Data

May 31, 2013 (KR) ........................ 10-2013-0063076

(51) Int. Cl.
*H01L 35/24* (2006.01)
*G09G 3/32* (2006.01)
(Continued)

(52) U.S. Cl.
CPC .......... *G09G 3/3208* (2013.01); *H01L 27/3276* (2013.01); *H01L 51/0031* (2013.01)

(58) Field of Classification Search
CPC ......... H01L 33/50; H01L 33/58; H01L 33/60; H01L 21/02521; H01L 21/02546; H01L 21/02579; H01L 21/0262; H01L 21/02642; H01L 21/02647; H01L 33/007; H01L 33/641; H01L 21/0237; H01L 21/0242; H01L 21/02458; H01L 33/36; H01L 33/64; H01L 21/0254; G09G 2310/0262; G09G 3/3233; G09G 3/3258; G09G 3/3266; G09G 3/3275; Y10S 977/742
USPC ......... 257/12–13, 40, 81, 84, 87–89, 98–100, 257/347–348, 433–434; 311/112, 501, 503, 311/506–507; 345/76, 82, 211–212
See application file for complete search history.

(56) References Cited

U.S. PATENT DOCUMENTS

| 7,417,215 | B2 | 8/2008 | Choi |
| 8,643,575 | B2 * | 2/2014 | Kim ................................. 345/82 |
| 2006/0139343 | A1 * | 6/2006 | Choi et al. ..................... 345/204 |

(Continued)

FOREIGN PATENT DOCUMENTS

| KR | 10-0700820 | 3/2007 |
| KR | 10-2011-0076574 | 7/2011 |

(Continued)

*Primary Examiner* — Dung A. Le
(74) *Attorney, Agent, or Firm* — H. C. Park & Associates, PLC

(57) ABSTRACT

Provided is an organic light-emitting display apparatus. The organic light-emitting display apparatus including: pixels arranged in a display region of a substrate and at intersections between scanning lines and data lines; a first initialization main line arranged along a first side of the display region of the substrate; a second initialization main line arranged along a second side of the display region of the substrate; an initialization power line electrically connected to the pixels and to the first initialization main line and the second initialization main line; and a first electrical connection portion comprising a doped semiconductor layer of which a first portion is connected to the first initialization main line and a second portion is connected to the initialization power line.

19 Claims, 7 Drawing Sheets

(51) Int. Cl.
*H01L 27/32* (2006.01)
*H01L 51/00* (2006.01)

(56) References Cited

U.S. PATENT DOCUMENTS

| | | |
|---|---|---|
| 2012/0026144 A1 | 2/2012 | Kang et al. |
| 2012/0162177 A1 | 6/2012 | Lee |
| 2014/0111563 A1* | 4/2014 | Hwang et al. ................ 345/691 |
| 2014/0168188 A1* | 6/2014 | Jun et al. ....................... 345/212 |

FOREIGN PATENT DOCUMENTS

| | | |
|---|---|---|
| KR | 10-2012-0010824 | 2/2012 |
| KR | 10-2012-0072098 | 7/2012 |

* cited by examiner

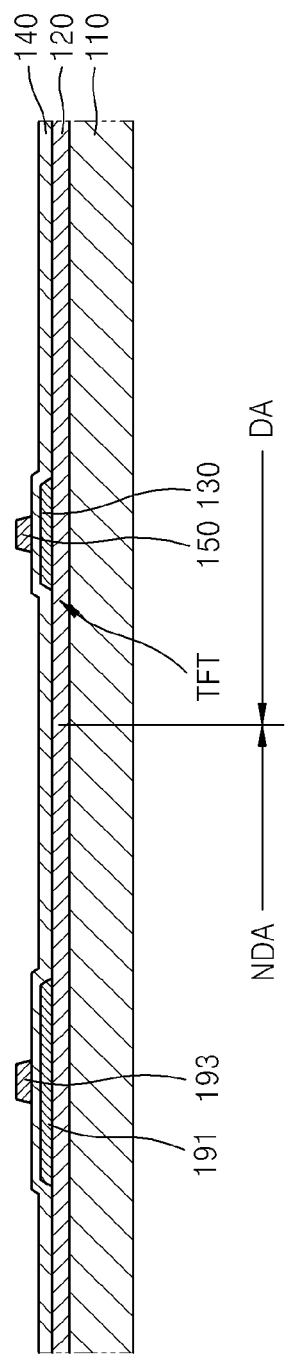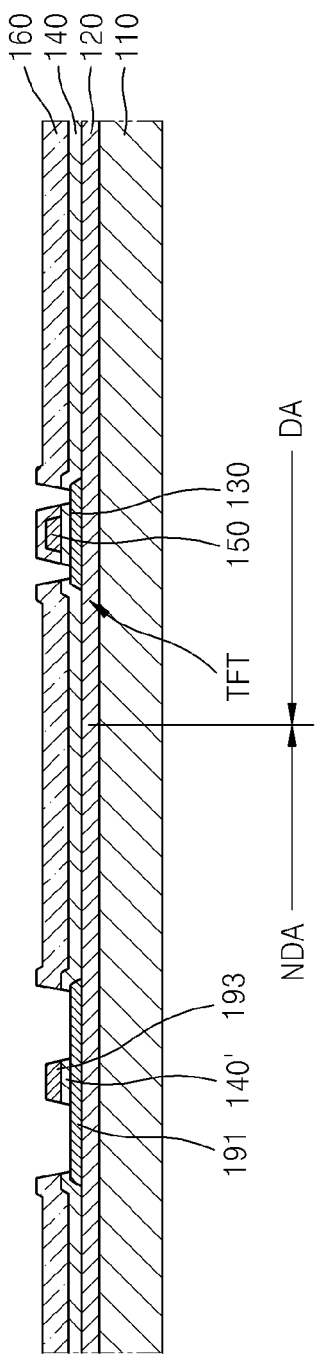

ORGANIC LIGHT-EMITTING DISPLAY APPARATUS

CROSS-REFERENCE TO RELATED APPLICATION

This application claims priority from and the benefit of Korean Patent Application No. 10-2013-0063076, filed on May 31, 2013, which is hereby incorporated by reference for all purposes as if fully set forth herein.

BACKGROUND OF THE INVENTION

1. Field

Exemplary embodiments of the present invention relate to an organic light-emitting display apparatus and a method of manufacturing the same, and more particularly, to an organic light-emitting display apparatus capable of effectively ascertaining whether a defect has been made during the manufacturing process, and a method of manufacturing the organic light-emitting display apparatus.

2. Discussion of the Background

In general, organic light-emitting display apparatuses are display apparatuses that include pixels each including an organic light-emitting device. A typical organic light-emitting device includes a pixel electrode, a counter electrode that is opposite to the pixel electrode, and an intermediate layer that is interposed between the pixel electrode and the counter electrode and includes at least an emission layer.

The organic light-emitting display apparatuses include pixel circuits for controlling the emission from the organic light-emitting device for each pixel. An electrical signal that is previously set is applied to the pixel circuits at a timing that is previously set. To this end, electrical lines extending into the display region from the outside are provided.

However, for a conventional organic light-emitting display apparatus, it is difficult to effectively ascertain during the manufacturing process whether the lines have a defect. That is, for a conventional organic light-emitting display apparatus, even when a certain line is defectively short-circuited or disconnected, the manufacturing process is typically continued because the short-circuiting or disconnection of the line is rarely detected in the middle of the process, which would likely result in the belated detection of the defects after the manufacturing of the product is completed.

SUMMARY OF THE INVENTION

Exemplary embodiments of the present invention provide an organic light-emitting display apparatus capable of effectively ascertaining whether a defect has occurred during the manufacturing process, and a method of manufacturing the organic light-emitting display apparatus.

According to one exemplary embodiment of the present disclosure, there is provided an organic light-emitting display apparatus including: pixels arranged in a display region of a substrate and at intersections between scanning lines and data lines; a first initialization main line arranged along a first side of the display region of the substrate; a second initialization main line arranged along a second side of the display region of the substrate; an initialization power line electrically connected to the pixels and to the first initialization main line and the second initialization main line; and a first electrical connection portion comprising a doped semiconductor layer of which a first portion is connected to the first initialization main line and a second portion is connected to the initialization power line.

According to one exemplary embodiment, there is provided an organic light-emitting display apparatus including: pixels arranged in a display region of a substrate and at intersections between scanning lines and data lines; a first initialization main line arranged along a first side of the display region of the substrate; a second initialization main line arranged along a second side of the display region of the substrate; an initialization power line electrically connected to the pixels and to the first initialization main line and the second initialization main line; and a first electrical connection portion comprising a conductive layer for electrically connecting the first initialization main line to the initialization power line.

According to one exemplary embodiment, there is provided a method of manufacturing an organic light-emitting display apparatus, the method comprising: forming a plurality of patterned semiconductor layers in a display region of a substrate, which comprises the display region and a non-display region outside the display region, and an additional semiconductor layer in the non-display region of the substrate; forming a first insulating layer so as to overlie the plurality of semiconductor layers and the additional semiconductor layer; forming gate electrodes on the plurality of semiconductor layers and a capping layer on the additional semiconductor layer; doping portions of the plurality of semiconductor layers which do not correspond to the gate electrodes and portions of the additional semiconductor layer which do not correspond to the capping layer, using the gate electrodes and the capping layer as masks; forming a second insulating layer to overlie the first insulating layer, the gate electrodes, and the capping layer; patterning the first insulating layer and the second insulating layer so as to expose source regions and drain regions of the plurality of semiconductor layers, at least part of the portions of the additional semiconductor layer which do not correspond to the capping layer, and a top surface of the capping layer; forming a conductive layer on the second insulating layer so as to overlie the portions of the plurality of semiconductor layers and the additional semiconductor layer that are not covered by the first insulating layer and the second insulating layer, and the capping layer; removing part of the conductive layer so as to form source electrodes and drain electrodes respectively connected to the source regions and the drain regions of the plurality of semiconductor layers, to remove the capping layer, to form a first initialization main line connected to a first portion of the additional semiconductor layer, and to form an initialization power line connected a second portion of the additional semiconductor layer; and doping portions of the additional semiconductor layer which are not doped.

According to one exemplary embodiment, there is provided a method of manufacturing an organic light-emitting display apparatus, the method comprising: forming a plurality of patterned semiconductor layers in a display region of a substrate, which comprises the display region and a non-display region outside the display region, and an additional semiconductor layer in the non-display region of the substrate; forming a first insulating layer to overlie the plurality of semiconductor layers and the additional semiconductor layer; forming gate electrodes on the plurality of semiconductor layers and a capping layer on the additional semiconductor layer; doping portions of the plurality of semiconductor layers which do not correspond to the gate electrodes and portions of the additional semiconductor layer which do not correspond to the capping layer, using the gate electrodes and the capping layer as masks; forming a second insulating layer to overlie the first insulating layer, the gate electrodes, and the capping layer; patterning the first insulating layer and the second insulating layer so as to expose source regions and drain regions of the plurality of semiconductor layers, at least part of the portions of the additional semiconductor layer which do not correspond to the capping layer, and a top surface of the capping layer; forming a conductive material layer on the second insulating layer so as to overlie the portions of the plurality of semiconductor layers and the additional semiconductor layer that are not covered by the first insulating layer and the second insulating layer, and the capping layer; removing part of the conductive material layer so as to form source electrodes and drain electrodes respectively connected to the source regions and the drain regions of the plurality of semiconductor layers, to form an initialization power line extending from the display region of the substrate into the non-display region, to form a first initialization main line along a first side of the display region on the substrate, to remove the capping layer, and to expose portions of the additional semiconductor layer which are not covered by the first insulating layer and the second insulating layer; and forming a conductive layer of a material used for a counter electrode of a pixel, the conductive layer connected to the initialization power line and the first initialization main line.

It is to be understood that both the foregoing general description and the following detailed description are exemplary and explanatory and are intended to provide further explanation of the invention as claimed.

BRIEF DESCRIPTION OF THE DRAWINGS

The above and other features and advantages of the present invention will become more apparent by describing in detail exemplary embodiments thereof with reference to the attached drawings.

FIGS. 5 to 8 are schematic cross-sectional views illustrating a manufacturing process of the organic light-emitting display apparatus of FIG. 1.

DETAILED DESCRIPTION OF THE ILLUSTRATED EMBODIMENTS

Figure 1:
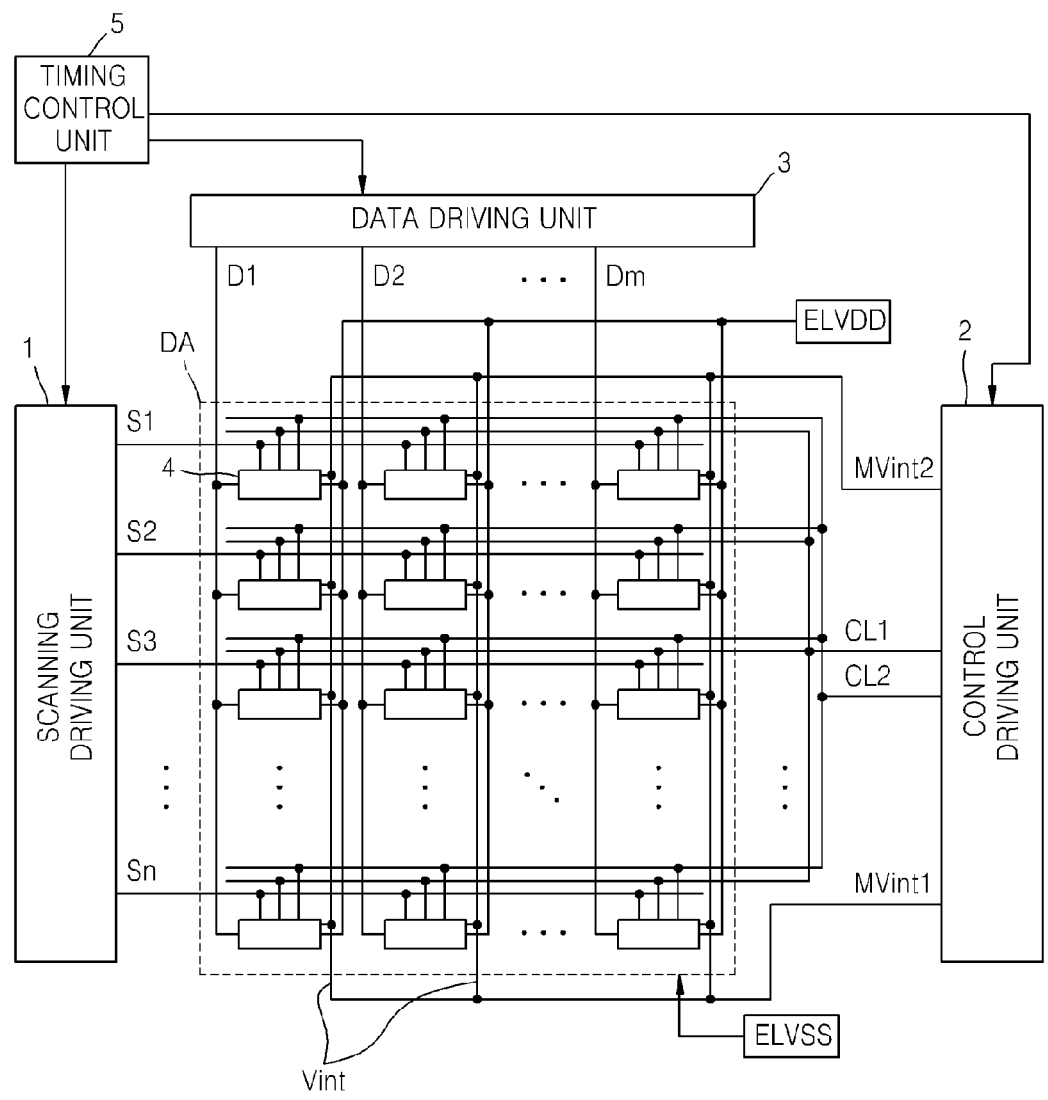
FIG. 1 is a schematic diagram of an organic light-emitting display apparatus according to one exemplary embodiment.

The present invention will now be described more fully with reference to the accompanying drawings, in which exemplary embodiments of the invention are shown. The invention may, however, be embodied in many different forms, and should not be construed as being limited to the embodiments set forth herein; rather, these embodiments are provided so that this disclosure will be thorough and complete, and will fully convey the concept of the invention to one of ordinary skill in the art. In the drawings, the thicknesses of layers and regions are exaggerated for clarity.

Throughout the specification, it will also be understood that when an element such as layer, region, or substrate is referred to as being "on" another element, it can be directly on the other element, or intervening elements are not present. As used herein, the term "and/or" includes any and all combinations of one or more of the associated listed items. Expressions such as "at least one of," when preceding a list of elements, modify the entire list of elements and do not modify the individual elements of the list. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

FIG. 1 is a schematic diagram of an organic light-emitting display apparatus according to one exemplary embodiment.

Referring to FIG. 1, the organic light-emitting display apparatus according to one exemplary embodiment may include scanning lines S1 to Sn, a first control line CL1, a second control line CL2, data lines D1 to Dm, a first initialization main line MVint1, a second initialization main line MVint2, and initialization power lines Vint. The organic light-emitting display apparatus according to one exemplary embodiment may also include a scanning driving unit 1 for driving the scanning lines S1 to Sn, a control driving unit 2 for driving the first control line CL1 and the second control line CL2, a data driving unit 3 for driving the data lines D1 to Dm, pixels 4 that are located at intersections between the scanning lines S1 to Sn and the data lines D1 to Dm, and a timing control unit 5 for controlling the driving units 1, 2, and 3. The pixels 4 may be located in a display region DA of a substrate. Some of the area other than the display region DA of the substrate may be referred to as a non-display region.

In accordance with one exemplary embodiment, the scanning driving unit 1 may sequentially apply scanning signals to the scanning lines S1 to Sn in each frame period. When the scanning signals are applied to the scanning lines S1 to Sn, horizontal arrangements of the pixels 4 are selected to receive the respective same scanning signals.

The data driving unit 3 applies data signals to the data lines D1 to Dm so as to be synchronized with the scanning signals. Thus, the data signals are applied to the pixels 4 that are selected by the scanning signals.

In accordance with one exemplary embodiment, the control driving unit 2 may respectively apply a first control signal and a second control signal to the first control line CL1 and the second control line CL2 that are commonly connected to each of the pixels 4. Here, the first control signal and the second control signal may be applied at the beginning of each frame period, for example, before the scanning signals are applied to the scanning lines S1 to Sn.

In accordance with one exemplary embodiment, a first power line ELVDD, a first control line CL1, a second control line CL2, and an initialization power line Vint may cross the display region DA and extend to the outside of the display region DA. The first initialization main line MVint1 is located on one side of the outside of the display region DA of the substrate, a second initialization main line MVint2 is located on the other side of the outside of the display region DA of the substrate, and the ends of each of initialization power lines Vint are electrically connected to the first initialization main line MVint1 and the second initialization main line MVint2, respectively.

The pixels 4 are located within the display region DA of the substrate. More specifically, the pixels 4 may be located at cross-sections between the scanning lines S1 to Sn (or the first control line CL1/the second control line CL2) and the data lines D1 to Dm according to one exemplary embodiment. The pixels 4 are charged with the data signals in response to the scanning signals applied to the scanning lines S1 to Sn during an $i_{th}$ frame period. The pixels 4 simultaneously emit light corresponding to the data signals, which were charged during an $i-1_{th}$ frame period, during the $i_{th}$ frame period. In addition, the pixels 4 are charged with the data signals in response to the scanning signals applied to the scanning lines S1 to Sn during an i+1$_{th}$ frame period. Then, the pixels 4 simultaneously emit light corresponding to the data signals, which were charged during the i$_{th}$ frame period, during the i+1$_{th}$ frame period in which the next data signals are charged.

Figure 2:
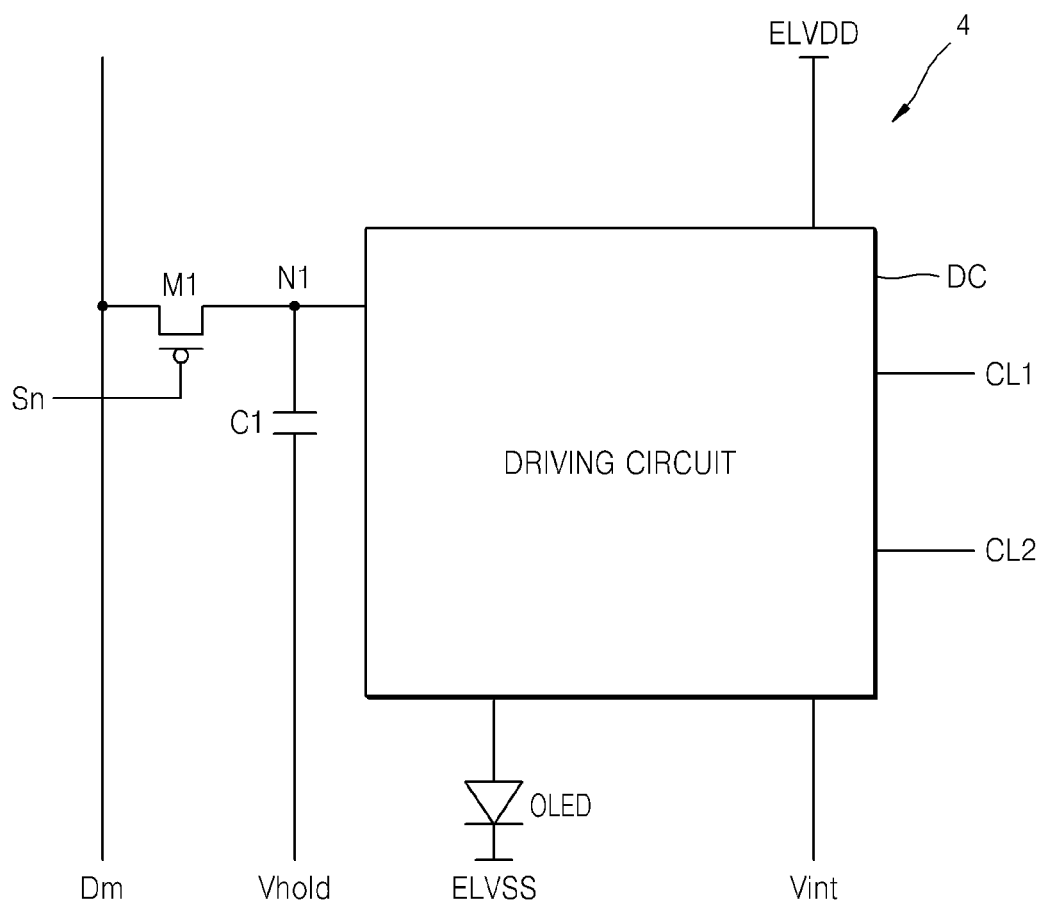
FIG. 2 is a schematic circuit diagram illustrating an example of a pixel illustrated in FIG. 1.

FIG. 2 is a schematic circuit diagram illustrating an example of a pixel illustrated in FIG. 1. Referring to FIG. 2, the pixel 4 of the organic light-emitting display apparatus according to one exemplary embodiment includes a first transistor M1, a first capacitor C1, a driving circuit DC, and an organic light-emitting device OLED.

In accordance with one exemplary embodiment, a pixel electrode of the organic light-emitting device OLED is connected to the driving circuit DC, and a counter electrode thereof is connected to a second power source ELVSS. The organic light-emitting device OLED may generate light with a predetermined brightness, in response to the amount of current that is applied from the driving circuit DC.

In accordance with one exemplary embodiment, a first electrode of the first transistor M1 may be connected to the data line Dm, while a second electrode may be connected to a first node N1 that is connected to the driving circuit DC. The gate electrode of the first transistor M1 is connected to the scanning line Sn. The first transistor M1 is turned on when the scanning signal is applied from the scanning line Sn.

In accordance with one exemplary embodiment, the first capacitor C1 may be connected between the first node N1 and a third power source Vhold. The first capacitor C1 is charged a voltage corresponding to the data signal applied from the data line Dm when the first transistor M1 is turned on.

In accordance with one exemplary embodiment, the third power source Vhold may be a fixed power source (for example, a direct current power source) which is set to a predetermined voltage (which may be changed to a low level/high level when needed). For example, the third power source Vhold may be set to the same voltage as the first power source ELVDD. The third power source Vhold may be an initialization power source that applies an initialization voltage when needed. In accordance with one exemplary embodiment, the third power source Vhold may be connected to the initialization power line Vint, the first initialization main line MVint1, or the second initialization main line MVint2. The third power source Vhold, the initialization power source, and the first power source ELVDD may have the same potential, when needed.

In accordance with one exemplary embodiment, the driving circuit DC connected to the initialization power line Vint may be initialized when the first control signal is applied to the first control line CL1, and may be charged with a predetermined voltage when the second control signal is applied to the second control line CL2, corresponding to the voltage in the first capacitor C1. The driving circuit DC charged with the predetermined voltage controls the amount of current that is applied to the organic light-emitting device OLED, corresponding to the voltage charged therein. That is, the driving circuit DC charged with the predetermined voltage causes a current corresponding to the charged voltage to flow from the first power source ELVDD to the second power source ELVSS via the organic light-emitting device OLED.

The driving circuit DC may be configured to be any suitable circuitry to achieve the functionalities as described above. That is, the driving circuit DC may be configured in a suitable manner to supply power from the first power source ELVDD to the organic light-emitting device OLED in response to the control signal as well as the data signal and the scanning signal. The configuration of the driving circuit DC is not limited to any exemplary embodiments specifically shown in the present disclosure.

Figure 3:
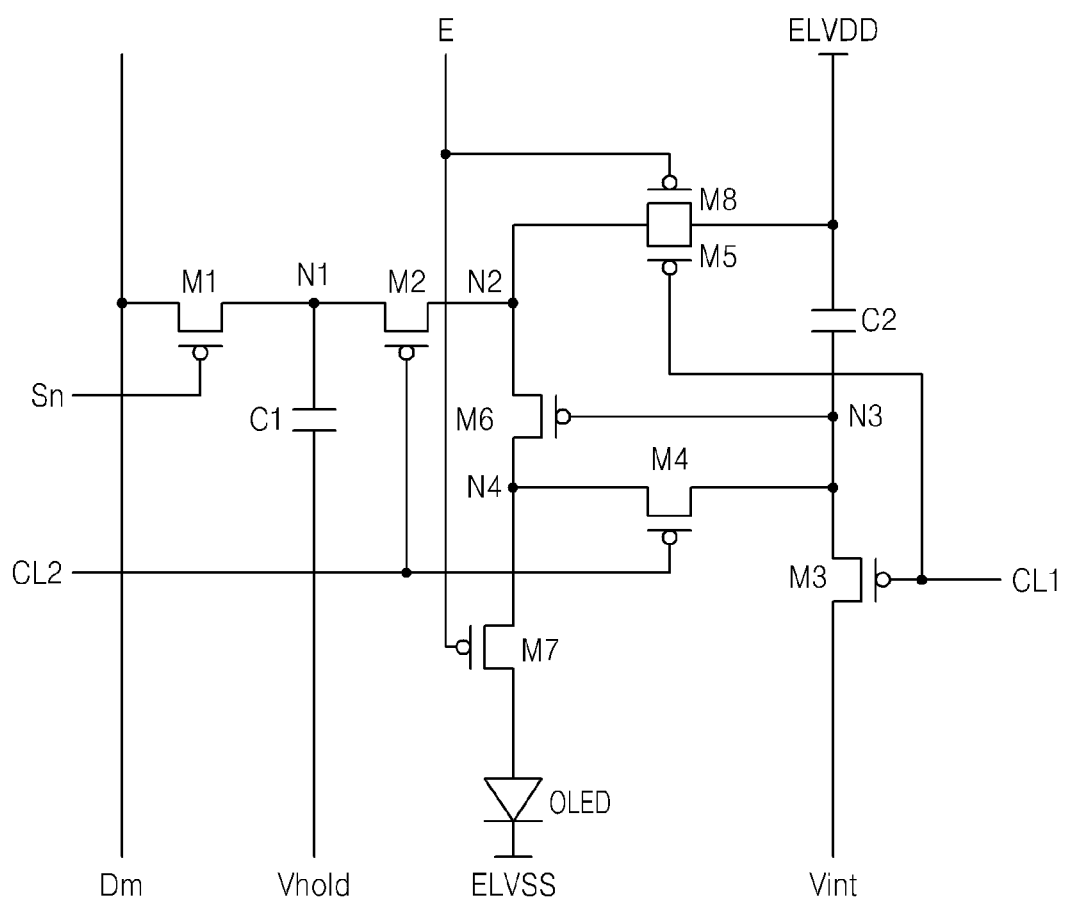
FIG. 3 is a schematic circuit diagram illustrating an example of the pixel illustrated in FIG. 1 including a driving circuit illustrated in FIG. 2.

FIG. 3 is a schematic circuit diagram illustrating an example of the pixel 4 illustrated in FIG. 1 including the driving circuit DC illustrated in FIG. 2.

Referring to FIG. 3, the driving circuit DC according to one exemplary embodiment may include, for instance, seven transistors M2 to M8 and one capacitor C2. Thus, the pixel circuit of each pixel 4 may include eight transistors M1 to M8 and two capacitors C1 and C2.

With respect to the second transistor M2, a first electrode may be connected to the first node N1, and a second electrode may be connected to a second node N2. In accordance with one exemplary embodiment, the second transistor M2 may be turned on prior to the first transistor M1 during a frame period, by the second control signal from the second control line CL2. The second transistor M2 is turned on when the second control signal is applied from the second control line CL2, and thus electrically connects the first node N1 and the second node N2.

With respect to the third transistor M3, a first electrode is connected to the initialization power line Vint, and a second electrode is connected to a third node N3. The third transistor M3 may be turned on prior to the second transistor M2 during a frame period, by the first control signal from the first control line CL1. The third transistor M3 is turned on when the first control signal is applied from the first control line CL1, and thus applies initialization power from the initialization power line Vint to the third node N3.

As for the fourth transistor M4, a first electrode is connected to the third node N3, and a second electrode is connected to a fourth node N4. The fourth transistor M4 may be turned on and turned off at the same time as the second transistor M2, by the second control signal from the second control line CL2. The fourth transistor M4 is turned on when the second control signal is applied from the second control line CL2, and thus connects the sixth transistor M6 in the form of a diode.

As for the fifth transistor M5, a first electrode is connected to the first power source ELVDD, and a second electrode is connected to the second node N2. The fifth transistor M5 may be turned on and turned off at the same time as the third transistor M3, by the first control signal from the first control line CL1.

When it comes to the sixth transistor M6, a first electrode is connected to the second node N2, a second electrode is connected to the fourth node N4, and the gate electrode is connected to the third node N3. The sixth transistor M6 applies a current corresponding to a voltage applied to the third node N3 to the second power source ELVSS via the organic light-emitting device OLED from the first power source ELVDD, while the seventh transistor M7 and the eighth transistor M8 are turned on by an emission control signal from an emission control line E.

As for the seventh transistor M7, a first electrode is connected to the fourth node N4, and a second electrode is connected to a pixel electrode of the organic light-emitting device OLED. The seventh transistor M7 is turned on when the first transistor M1 is turned on during the frame period by the emission control signal from the emission control line E, and then maintains its turn-on state.

As for the eighth transistor M8, a first electrode is connected to the first power source ELVDD, and a second electrode is connected to the second node N2. Similarly to the seventh transistor M7, the eighth transistor M8 is turned on when the first transistor M1 is turned on during the frame period by the emission control signal from the emission control line E, and then maintains its turn-on state.

With respect to the second capacitor C2, a first electrode is connected to the third node N3, and a second electrode is connected to the first power source ELVDD. The second capacitor C2 is charged in response to a voltage supplied from the first capacitor C1 when the second transistor M2 and the fourth transistor M4 are turned on.

Figure 4:
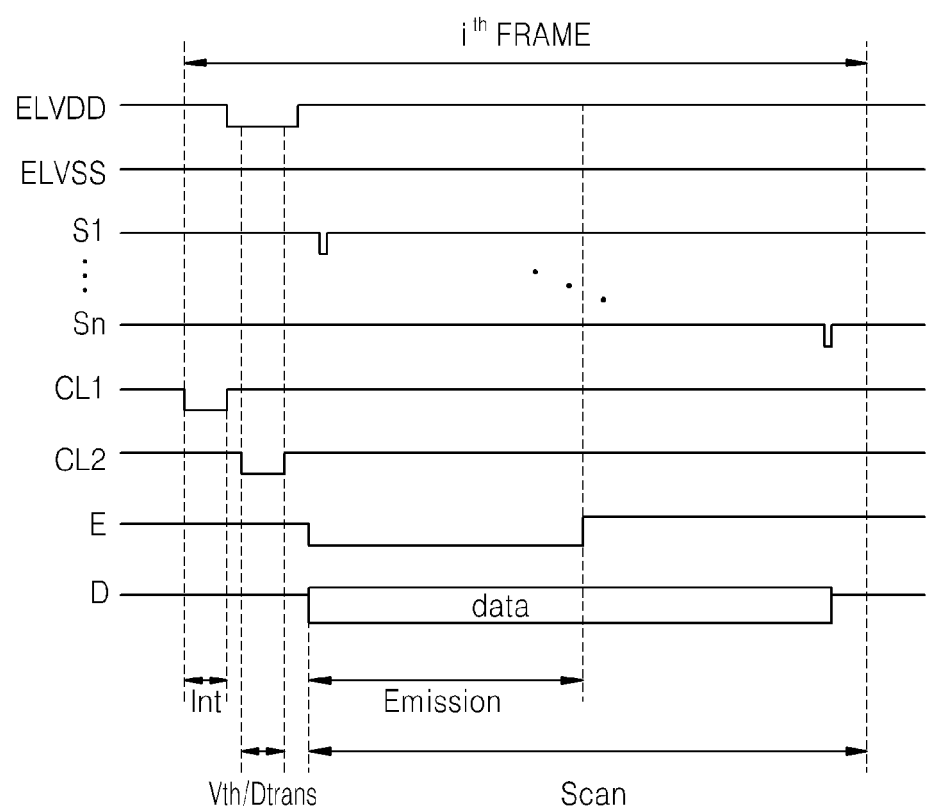
FIG. 4 is a waveform diagram illustrating a method of driving the pixel illustrated in FIG. 3.

FIG. 4 is a waveform diagram illustrating a method of driving the pixel illustrated in FIG. 3. In accordance with one exemplary embodiment, each pixel 4 may be driven using a simultaneous emission method, and may be operated distinctively depending on multiple periods for each frame, for instance, including an initialization period Int, a compensation/data transition period Vth/Dtrans, and a scanning/emission period Scan/Emission for each frame. In the scanning/emission period Scan/Emission, the scanning signals are sequentially input to the scanning lines, and in response, the data signals are sequentially input to the pixels 4. In accordance with one exemplary embodiment, the initialization and threshold voltage compensation of driving transistors included in each pixel 4, data transition, and the emission operation of the pixels 4 are simultaneously implemented for each frame.

Referring to FIG. 4, in the initialization period Int which is the beginning of the ith frame period, a voltage of the first power source ELVDD is set to be in a high level, and a voltage of the second power source ELVSS, and the first control signal of the first control line CL1 are set to be in a low level. Accordingly, the third transistor M3 and the fifth transistor M5 are turned on, and thus the voltage of the first power source ELVDD is applied to the second node N2, causing the initialization power of the initialization power line Vint to be applied to the third node N3.

In the compensation/data transition period Vth/Dtrans, the voltage of the first power source ELVDD, the voltage of the second power source ELVSS, and the second control signal of the second control line CL2 are set to be in a low level. Accordingly, the second transistor M2 is turned on, and thus a voltage corresponding to a data signal D written in the pixel 4 during the scanning period of the i−1th frame, which is stored in the first capacitor C1, is applied to the second node N2, that is, the first electrode of the sixth transistor M6.

In accordance with one exemplary embodiment, when the third node N3 is initialized using an initialization voltage of the initialization power line Vint which is lower than the data signal, the sixth transistor M6 connected in the form of a diode is turned on. When the sixth transistor M6 is turned on, a voltage obtained by subtracting a threshold voltage of the sixth transistor M6 from the voltage applied to the first electrode of the sixth transistor M6 (i.e., the voltage corresponding to the data signal D written in the pixel 4 during the scanning period of the i−1th frame and stored in the first capacitor C1), is applied to the third node N3. At this time, the second capacitor C2 is charged with a voltage corresponding to the voltage applied to the third node N3. That is, the second capacitor C2 is charged with a voltage corresponding to the data signal D applied during the i−1th frame period and subtracted by what is used for compensating the threshold voltage of the sixth transistor M6.

In the scanning/emission period Scan/Emission, scanning and emission operations are simultaneously performed. In the scanning/emission period Scan/Emission, the voltage of the first power source ELVDD is set to be in a high level, and the voltage of the second power source ELVSS and the emission control signal of the emission control line E are set to be in a low level. Then, the low level scanning signals are sequentially input to each of the scanning lines S1 to Sn, and thus the first transistor M1 is turned on, thereby causing the data signal D of the $i_{th}$ frame to be sequentially input to the pixel 4 connected to each scanning line. Thus, a voltage corresponding to the data signal of the $i_{th}$ frame is stored in the first capacitor C1.

Meanwhile, in the scanning/emission period Scan/Emission, the second transistor M2 is turned off so as to block the first node N1 and the second node N2. Then, the seventh transistor M7 and the eighth transistor M8 are turned on, and thus the first electrode of the sixth transistor M6 is electrically connected to the first power source ELVDD, while the second electrode is electrically connected to the pixel electrode of the organic light-emitting device OLED. In accordance with one exemplary embodiment, the sixth transistor M6 controls the amount of current that flows from the first power source ELVDD to the second power source ELVSS via the organic light-emitting device OLED, in response to the voltage applied to the third node N3. That is, the organic light-emitting device OLED emits light with a brightness corresponding to the data signal that is written in the pixel 4 during the scanning period of the $i-1_{th}$ frame which is stored in the second capacitor C2. In accordance with one exemplary embodiment, all the pixels 4 within the display region may simultaneously emit light.

That is, in the scanning/emission period Scan/Emission, the data signal of the $i_{th}$ frame is sequentially input according to the scanning signal, and also all the pixels 4 within the display region may simultaneously emit light in response to the data signal of the $i_{th}$ frame. On the other hand, the emission period Emission may partially overlap the scanning period Scan, and may be executed more shortly than the scanning period Scan.

In an organic light-emitting display apparatus according to one exemplary embodiment, the first capacitor C1, which is described below to be connected to the third power source Vhold, may be connected to the initialization power line Vint as described above, for convenience of design. In this case, when the first transistor M1 is turned on and thus the data signal D is applied to the first node N1, if the voltage of the initialization power line Vint to which the first capacitor C1 is connected is not maintained stable, the data signal D may not accurately be applied to the first node N1.

Therefore, in an organic light-emitting display apparatus according to one exemplary embodiment, as illustrated in FIG. 1, the first initialization main line MVint1 may be arranged on one side of the outside of the display region DA of the substrate, and the second initialization main line MVint2 may be arranged on the other side thereof, while the ends of the initialization power line Vint crossing the display region DA are connected to the first initialization main line MVint1 and the second initialization main line MVint2, respectively. Thus, when compared with a case where only one initialization main line is provided, and only one end of the initialization power line Vint is connected to the one initialization main line, the stability and uniformity of the initialization power source in the initialization power line Vint may be significantly increased by minimizing the influence due to IR drop or the like.

On the other hand, during the manufacturing process of an organic light-emitting display apparatus according to one exemplary embodiment, before forming the pixel electrode, the intermediate layer including the emission layer, and the counter electrode, a process of checking whether various transistors and lines as illustrated in FIGS. 1 and 3 are correctly formed may be performed. This is because performing the process of forming the organic light-emitting device OLED, while some of the formed transistors and the lines have defects, would not be economical and likely results in the increase in the whole manufacturing cost.

Whether the transistors and the lines are correctly formed may be detected using various methods. In particular, in the case of the initialization power lines Vint, it may be effectively ascertained whether defects such as disconnections and short-circuiting on the initialization power lines Vint have been created, by connecting a testing terminal to specific points of each of the initialization power lines Vint and measuring the electrical signal values accordingly.

Unlike FIG. 1, when only the second initialization main line MVint2 is provided on the other side of the display region DA, and the initialization power lines Vint are electrically connected only to the second initialization main line MVint2 (i.e., when the first initialization main line MVint1 is not provided), defects such as short-circuiting or disconnections on the initialization power lines Vint may be easily ascertained. In this case, disconnections or short-circuiting on the initialization power lines Vint may be easily ascertained by connecting a testing terminal to the initialization power lines Vint on the opposite side of the second initialization main line MVint2 and measuring the electrical signals accordingly. This is because when an initialization power line is defective (e.g., disconnected or short-circuited), the testing terminal will be able to detect an abnormal signal from the short-circuited or disconnected initialization power line Vint that is different from the other normal initialization power lines, which will not be possible when the second initialization main line MVint2 is electrically connected to the initialization power line Vint.

However, as illustrated in FIG. 1, when the first initialization main line MVint1 is arranged on one side of the display region DA, the second initialization main line MVint2 is arranged on the other side of the display region DA, and the ends of the initialization power lines Vint are electrically connected to the first initialization main line MVint1 and the second initialization main line MVint2, the short-circuiting or disconnecting of the initialization power lines Vint cannot easily detected. This is because even if any one initialization main line is short-circuited or disconnected, the testing terminal is electrically connected to the other initialization main lines Vint, the first initialization main line MVint1, and the second initialization main line MVint2, and thus cannot measure an abnormally different electrical signal.

Accordingly, for an organic light-emitting display apparatus according to one exemplary embodiment, which may include the first initialization main line MVint1, the second initialization main line MVint2, and the initialization power lines Vint as illustrated in FIG. 1, formation defects on the initialization power lines Vint such as short-circuiting or disconnecting may be effectively detected according to one exemplary embodiment as is described below in detail.

FIGS. 5 to 8 are schematic cross-sectional views illustrating a manufacturing process of the organic light-emitting display apparatus of FIG. 1.

First, as illustrated in FIG. 5, a plurality of patterned semiconductor layers 130 are formed within the display region DA of a substrate 110, and an additional semiconductor layer 191 may be formed on one side of the display region DA of the substrate 110. For instance, the additional semiconductor layer 191 may be formed in a non-display region NDA of the substrate 110. In accordance with one exemplary embodiment, the semiconductor layers 130 and the additional semiconductor layer 191 may be simultaneously formed by the same process so as to include silicon. The semiconductor layers 130 may serve as an active layer of the transistors M1 to M8 illustrated in FIG. 3. The additional semiconductor layer 191 may be formed as islands or formed to extend along the NDA. In one exemplary embodiment, the additional semiconductor layer 191 may be formed as islands so that the initialization power lines Vint are electrically disconnected with the first initialization main line MVint.

The substrate 110 may be formed of various materials such as a glass material, a metal material, or a plastic material. If appropriate, before forming the semiconductor layers 130 and the additional semiconductor layer 191, a process of forming a buffer layer 120 including, for instance, silicon oxide or silicon nitride may be performed on the substrate 110 in order to planarize the surface of the substrate 110 or to prevent impurities or the like from penetrating the semiconductor layer 130.

After forming the semiconductor layers 130 and the additional semiconductor layer 191, a first insulating layer 140 may be formed of silicon oxide and/or silicon nitride so as to cover the semiconductor layers 130 and the additional semiconductor layer 191. The first insulating layer 140 may be, for example, a gate insulating layer.

Thereafter, gate electrodes 150 and a capping layer 193 are formed on the first insulating layer 140. The gate electrodes 150 and the capping layer 193, which may be formed of the same material, may be formed at the same time by the same process. The gate electrodes 150 and the capping layer 193 may be formed of at least one of, for example, aluminum (Al), platinum (Pt), palladium (Pd), silver (Ag), magnesium (Mg), gold (Au), nickel (Ni), neodymium (Nd), iridium (Ir), chrome Cr), lithium (Li), calcium (Ca), molybdenum (Mo), titanium (Ti), tungsten (W), and copper (Cu) so as to have a single-layered structure or a multi-layered structure.

In accordance with one exemplary embodiment, after forming the gate electrodes 150 and the capping layer 193, portions of the plurality of semiconductor layers 130 which do not correspond to the gate electrodes 150 and portions of the additional semiconductor layer 191 which do not correspond to the capping layer 193 are doped using the gate electrodes 150 and the capping layer 193 as masks. Accordingly, portions of the plurality of semiconductor layers 130 which correspond to the gate electrodes 150 and portions of the additional semiconductor layer 191 which correspond to the capping layer 193 are not doped, and thus those portions remain without having conductivity.

Thereafter, a second insulating layer 160 is formed so as to cover the first insulating layer 140, the gate electrodes 150, and the capping layer 193, and is then patterned. In this manner, as illustrated in FIG. 6, the source region and the drain region of each of the plurality of semiconductor layers 130, at least one portion of the additional semiconductor layer 191 which does not correspond to the capping layer 193, and the top surface of the capping layer 193 are exposed. The second insulating layer 160 that is formed in this manner may be considered as an insulating interlayer. The second insulating layer 160 may be formed of a material such as silicon oxide or silicon nitride so as to have a single-layered structure or a multi-layered structure.

Meanwhile, part of the first insulating layer 140 is also removed during the patterning of the second insulating layer 160. Thus, as illustrated in FIG. 6, an island insulating layer 140' having an island shape corresponding to the shape of the capping layer 193 is interposed between the additional semiconductor layer 191 and the capping layer 193. The island insulating layer 140' may be considered as a layer resulting from pattering the first insulating layer 140.

Figure 7:
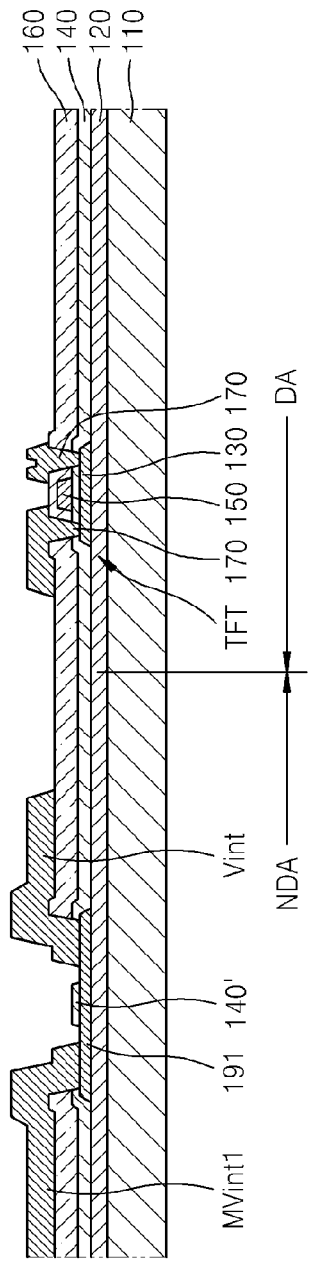

Thereafter, a conductive layer is formed on the second insulating layer 160 so as to cover portions of the plurality of semiconductor layers 130 and the additional semiconductor layer 191 that are not covered by the first insulating layer 140 and the second insulating layer 160, and the capping layer 193, and then the conductive layer is patterned. As illustrated in FIG. 7, source/drain electrodes 170 contacting the source region and the drain region of each of the plurality of semiconductor layers 130 are formed, and the capping layer 193 is removed, through the patterning. In addition, the first initialization main line MVint1 contacting one side of the additional semiconductor layer 191 and the initialization power line Vint contacting the other side of the additional semiconductor layer 191 are formed. That is, the source/drain electrodes 170, the first initialization main line MVint1, and the initialization power line Vint, which are formed of the same material, may be formed at the same time. The second initialization main line MVint2 (not shown) may also be formed at the same time on the other side of the substrate. In this case, the initialization power line Vint may be directly or electrically connected to the second initialization main line MVint2.

The source/drain electrodes 170, the first initialization main line MVint1, the initialization power line Vint, and/or the second initialization main line MVint2 may be formed of at least one of, for example, aluminum (Al), platinum (Pt), palladium (Pd), silver (Ag), magnesium (Mg), gold (Au), nickel (Ni), neodymium (Nd), iridium (Ir), chrome Cr), lithium (Li), calcium (Ca), molybdenum (Mo), titanium (Ti), tungsten (W), and copper (Cu) so as to have a single-layered structure or a multi-layered structure.

In accordance with one exemplary embodiment, it can be effectively ascertained whether the initialization power line Vint has a defect such as short-circuiting or disconnecting. That is, one end of the initialization power line Vint is not electrically connected to the first initialization main line MVint1, but the other end thereof is electrically connected to the second initialization main line MVint2. This is because one end of the initialization power line Vint contacts one end of the additional semiconductor layer 191, and the first initialization main line MVint1 also contacts the other end of the additional semiconductor layer 191, but the portion of the additional semiconductor layer 191 corresponding to the island insulating layer 140' is not doped, and thus the conductivity of the additional semiconductor layer 191 is extremely low. Therefore, it may be effectively ascertained whether each of the initialization power lines Vint has a defect such as short-circuiting or disconnecting by connecting a testing terminal to the initialization power lines Vint on the opposite side of the second initialization main line MVint2 instead of the side where the second initialization main line MVint2 is arranged. It may also be effectively ascertained whether wires and signal lines other than the initialization power lines Vint, or circuit elements such as thin film transistors are correctly formed or defective.

Referring back to FIG. 7, the portion of the additional semiconductor layer 191 which has not been doped may be doped after the testing. Since the island insulating layer 140' is not a metal layer unlike the capping layer 193, dopants may pass through the island insulating layer 140' and may be injected into the additional semiconductor layer 191. Portions of the additional semiconductor layer 191 which do not correspond to the island insulating layer 140' are already doped. As a result, the doping concentration in the portion of the additional semiconductor layer 191 which does not correspond to the island insulating layer 140' is higher than the doping concentration in the portion of the additional semiconductor layer 191 which corresponds to the island insulating layer 140'. The initialization power lines Vint may be electrically connected to the first initialization main line MVint1 through the doping.

Figure 8:
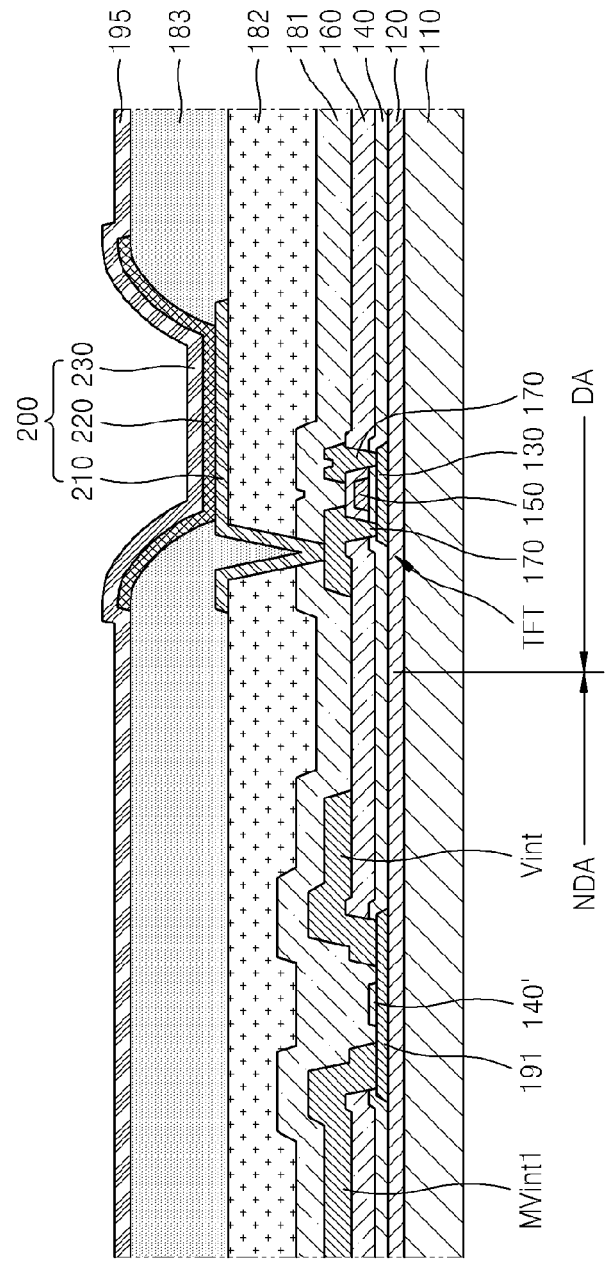

Thereafter, a passivation film 181 and a planarization film 182 may be formed in the display region DA and the non-display region NDA so as to cover a transistor TFT and the like. Further, the following steps may be performed: a pixel electrode 210 electrically connected to the transistor TFT may be formed on the planarization film 182; a pixel-definition film 183 may be formed so as to expose at least a central portion of the pixel electrode 210; an intermediate layer 220 including an emission layer may be formed on at least the pixel electrode 210; and a counter electrode 230 may be integrally formed in the display region DA so as to cover the intermediate layer 220, thereby manufacturing the organic light-emitting display apparatus as illustrated in FIG. 8. Here, the components including the pixel electrode 210, the intermediate layer 220, and the counter electrode 230 may be referred to as an organic light-emitting device (OLED) 200.

Figure 9:
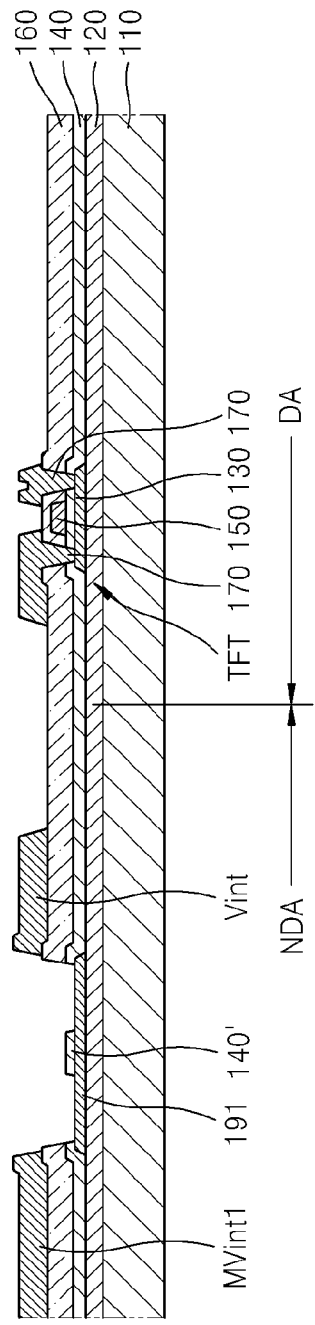
FIGS. 9 and 10 are schematic cross-sectional views illustrating a manufacturing process of an organic light-emitting display apparatus according to one exemplary embodiment.
Figure 10:
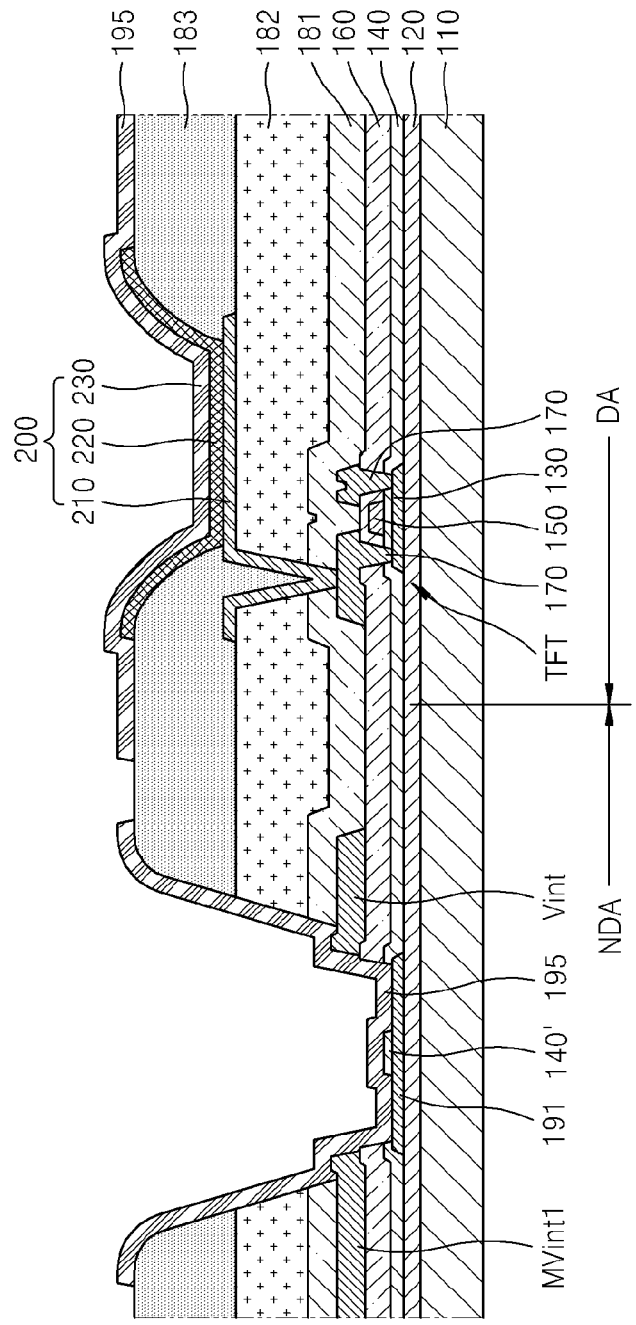

FIGS. 9 and 10 are schematic cross-sectional views illustrating a manufacturing process of an organic light-emitting display apparatus according to one exemplary embodiment. First, as described above with reference to FIGS. 6 and 7, after the first insulating layer 140 and the second insulating layer 160 are patterned, a conductive layer is formed on the second insulating layer 160 so as to cover the capping layer 193 and the portions of the plurality of semiconductor layers 130 and the additional semiconductor layer 191, which are not covered by the first insulating layer 140 and the second insulating layer 160, and then the conductive layer is patterned.

As illustrated in FIG. 9, the source/drain electrodes 170 contacting the source region and the drain region of each of the plurality of semiconductor layers 130 are formed, and the capping layer 193 is removed by the patterning. In addition, the initialization power line Vint, which extends toward one side of the outside of the display region DA, and the first initialization main line MVint1, which is provided on the side of the outside of the display region DA, are formed in the display region DA of the substrate 110, and the portions of the additional semiconductor layer 191 which are not covered by the first insulating layer 140 and the second insulating layer 160 are exposed. Although FIG. 9 illustrates the initialization power line Vint being present only in the outside of the display region DA, this is for convenience of description, and the initialization power line Vint may be formed in the display region DA so as to extend toward the outside of the display region DA, as illustrated in FIG. 1, for instance.

In this manner, the source/drain electrodes 170, the first initialization main line MVint1, and the initialization power line Vint, which may be formed of the same material according to one exemplary embodiment, may be formed at the same time by the same process. The second initialization main line MVint2 may also be formed at the same time by the same process. In this case, the initialization power line Vint may be directly or electrically connected to the second initialization main line MVint2.

In this case, it may be effectively ascertained whether the initialization power line Vint has a defect such as a disconnection or short-circuiting. That is, one end of the initialization power line Vint is not electrically connected to the first initialization main line MVint1, but the other end thereof is electrically connected to the second initialization main line MVint2. Therefore, it may be effectively ascertained whether each of the initialization power lines Vint is defective (e.g., disconnected or short-circuited) by using a testing terminal on each of the initialization power lines Vint on the opposite side of the second initialization main line MVint2 instead of the side of the second initialization main line MVint2. It may also be effectively ascertained whether wires and signal lines other than the initialization power lines Vint, or circuit components such as thin film transistors are correctly formed.

Thereafter, the passivation film 181 and the planarization film 182 may be formed in the display region DA and the non-display region NDA so as to cover the transistor TFT and the like. Further, the following steps may be performed: the pixel electrode 210 electrically connected to the transistor TFT may be formed on the planarization film 182; the pixel-definition film 183 may be formed so as to expose at least the central portion of the pixel electrode 210; the intermediate layer 220 including an emission layer may be formed on at least the pixel electrode 210; and the counter electrode 230 may be integrally formed in the display region DA so as to cover the intermediate layer 220, thereby manufacturing the organic light-emitting display apparatus as illustrated in FIG. 10.

At this time, when a contact hole is formed in the passivation film 181 and the planarization film 182 in order to electrically connect the pixel electrode 210 and the transistor TFT to each other, portions of the passivation film 181 and the planarization film 182 above the additional semiconductor layer 191 may also be removed. In addition, when the pixel-definition film 183 is patterned so as to expose at least the central portion of the pixel electrode 210, the portion of the pixel-definition film 183 above the additional semiconductor layer 191 may also be removed. Then, a conductive layer 195, which contacts the initialization power line Vint and the first initialization main line MVint1, may be formed of the same material as the counter electrode 230 at the same time when the counter electrode 230 is formed. Further, the conductive layer 195 may be formed where the additional semiconductor layer 191 is located. The initialization power lines Vint may be electrically connected to the first initialization main line MVint1 through the conductive layer 195.

Referring back to FIG. 9, the portion of the additional semiconductor layer 191 which has not been doped may be doped when necessary. In this case, since the island insulating layer 140' is not a metal layer unlike the capping layer 193, dopants may pass through the island insulating layer 140' and may be injected into the additional semiconductor layer 191. The portions of the additional semiconductor layer 191 which do not correspond to the island insulating layer 140' are already doped. As a result, a doping concentration in the portion of the additional semiconductor layer 191 which does not correspond to the island insulating layer 140' is higher than a doping concentration in the portion of the additional semiconductor layer 191 which corresponds to the island insulating layer 140'.

Referring to FIG. 10, the conductive layer 195 may be formed in accordance with one exemplary embodiment. At this time, the passivation film 181, the planarization film 182, and the pixel-definition film 183 are already present as well as the first insulating layer 140 and the second insulating layer 160, and thus the conductive layer 195 may not be uniformly formed on the bottom surface (That is, the top surface of the additional semiconductor layer 191) which is at relatively deep areas inside the openings of the films, and thus, the conductive layer 195 may have defects such as disconnections. When the conductive layer 195 is formed to be disconnected unintentionally, the initialization power line Vint and the first initialization main line MVint1 may not be electrically connected to each other.

In accordance with one exemplary embodiment, however, when the additional semiconductor layer 191 is doped to thereby have conductivity, the initialization power lines Vint may be reliably electrically connected to the first initialization main line MVint1 through the conductive layer 195 and additionally the doped additional semiconductor layer 191. That is, even if the conductive layer 195 is disconnected, when a part of the conductive layer 195 electrically connects the first initialization main line MVint1 and the additional semiconductor layer 191 to each other and another part thereof electrically connects the initialization power line Vint and the additional semiconductor layer 191 to each other, the initialization power lines Vint may be electrically connected to the first initialization main line MVint1 through the conductive layer 195 and the doped additional semiconductor layer 191.

A method of manufacturing an organic light-emitting display apparatus has been described so far, but the present invention is not limited thereto. An organic light-emitting display apparatus is also within the scope of the present invention.

For example, as illustrated in FIG. 1 to FIG. 3 and FIG. 8, an organic light-emitting display apparatus according to one exemplary embodiment of the present invention may include the pixels 4 that are located within the display region DA of the substrate 110 and located at intersections between the scanning lines S1 to Sn and the data lines D1 to Dm, the first initialization main line MVint1 that is located on one side of the outside of the display region DA of the substrate 110, the second initialization main line MVint2 that is located on the other outside of the display region DA of the substrate 110, the initialization power lines Vint which are electrically connected to the pixels 4 and of which the ends are electrically connected to the first initialization main line MVint1 and the second initialization main line MVint2, respectively, and a first electrical connection portion that includes the additional semiconductor layer 191 contacting the first initialization main line MVint1 on one side thereof and contacting the initialization power line Vint on the other side thereof, so as to electrically connect the first initialization main line MVint1 and the initialization power line Vint. For the device shown in FIG. 8, the first electrical connection portion refers to the doped additional semiconductor layer 191.

In an organic light-emitting display apparatus according to one exemplary embodiment, it may be easily ascertained whether the initialization power line Vint is defective (e.g., short-circuited or disconnected) during the manufacturing process, and it is possible to significantly increase the uniformity of the initialization power that is supplied to the pixels 4 of the display region DA through the initialization power line Vint.

In accordance with one exemplary embodiment, the doped additional semiconductor layer 191 may be located on the same layer as the semiconductor layer 130 of the thin film transistor included in the pixel 4. The initialization power line Vint may be located on the same layer as the source/drain electrodes 170 of the thin film transistor TFT included in the pixel 4, and may be in contact with the additional semiconductor layer 191 that is doped through an opening for exposing at least a part of the doped additional semiconductor layer 191 of the second insulating layer 160 that is located below the initialization power line Vint.

As another example, the initialization power line Vint may be located on the same layer as other components such as the gate electrode 150 instead of being located on the same layer as the source/drain electrodes 170. In this case, the conductive layer, which is located on the same layer as the source/drain electrodes 170 and contacts the additional semiconductor layer 191, may be electrically connected to the initialization power line Vint, which is located on a different layer from the conductive layer, through a contact hole or the like.

As illustrated in FIG. 8, the first initialization main line MVint1 may be located on the second insulating layer 160, and may contact with the additional semiconductor layer 191 that is doped through the opening for exposing at least a part of the doped semiconductor layer 191 of the second insulating layer 160. Meanwhile, the island insulating layer 140' having an island shape may be located between the doped portions of the additional semiconductor layer 191, and the island insulating layer 140' may include the same material as the first insulating layer 140 under the second insulating layer 160 that is located below the initialization power line Vint.

An organic light-emitting display apparatus according to one exemplary embodiment of the present invention may have a configuration as illustrated in FIGS. 1 to 3 and FIG. 10. That is, an organic light-emitting display apparatus according to one exemplary embodiment of the present invention may include a second electrical connection portion that includes the conductive layer 195 that contacts the first initialization main line MVint1 on one end and the initialization power line Vint on the other side so as to electrically connect the first initialization main line MVint1 and the initialization power line Vint. Here, the second electrical connection portion may be considered as the conductive layer 195 itself.

In an organic light-emitting display apparatus according to one exemplary embodiment, it may be easily ascertained whether the initialization power line Vint has defects (e.g., disconnections or short-circuiting) created during the manufacturing process, and it is possible to significantly increase the uniformity of the initialization power supplied to the pixels 4 of the display region DA through the initialization power line Vint.

In accordance with one exemplary embodiment, the conductive layer 195 may be formed at the same time as the counter electrode 230 by the same process. That is, the conductive layer 195 may include the same material as that of the counter electrode 230. The conductive layer 195 may directly contact with the initialization power line Vint and the first initialization main line MVint1, as shown in FIG. 10.

The conductive layer 195 may further include the first electrical connection portion as mentioned above, that is, the doped additional semiconductor layer 191, and the doped additional semiconductor layer 191 may contact the conductive layer 195.

Although pixel 4 including such a pixel circuit as illustrated in FIG. 3 has been described, exemplary embodiments of the present invention are not limited thereto. That is, as long as an organic light-emitting display apparatus includes the first initialization main line MVint1 located on one side of the outside of the display region DA of the substrate 110, the second initialization main line MVint2 located on the other side of the outside of the display region DA of the substrate 110, and the initialization power lines Vint that are electrically connected to the first initialization main line MVint1 and the second initialization main line MVint2, the pixel circuit may be modified in various ways.

In addition, the above-mentioned first electrical connection portion and/or the second electrical connection portion may be located between each of the plurality of initialization power lines Vint and the first initialization main line MVint1.

The above-described embodiments of the present invention may realize an organic light-emitting display apparatus capable of effectively ascertaining whether a defect has occurred during the manufacturing process, and a method of manufacturing the organic light-emitting display apparatus.

However, the scope of the present invention is not limited to those exemplary embodiments.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting display apparatus comprising:
    pixels arranged in a display region of a substrate and at intersections between scanning lines and data lines;
    a first initialization main line arranged along a first side of the display region of the substrate;
    a second initialization main line arranged along a second side of the display region of the substrate;
    an initialization power line connected to the pixels and to the first initialization main line and the second initialization main line; and
    a first electrical connection portion comprising a doped semiconductor layer of which a first portion is connected to the first initialization main line and a second portion is connected to the initialization power line.

2. The organic light-emitting display apparatus of claim 1, wherein each pixel comprises a thin film transistor comprising a semiconductor layer and source and drain electrodes, and the doped semiconductor layer is disposed on the same layer as the semiconductor layer.

3. The organic light-emitting display apparatus of claim 2, wherein the initialization power line is disposed on the same layer as the source and drain electrodes of the thin film transistor and overlies a first insulating layer comprising an opening exposing at least part of the doped semiconductor layer, and
    wherein the initialization power line is connected to the doped semiconductor layer through the opening.

4. The organic light-emitting display apparatus of claim 3, wherein the first initialization main line is disposed on the first insulating layer and is connected to the doped semiconductor layer through the opening of the first insulating layer.

5. The organic light-emitting display apparatus of claim 1, further comprising:
    a second insulating layer underlying the first insulating layer that underlies the initialization power line; and
    an island insulating layer in an island shape disposed on at least part of the doped semiconductor layer and exposing sides of the doped semiconductor,
    wherein the island insulating layer comprises the same material as the second insulating layer.

6. The organic light-emitting display apparatus of claim 1, wherein each of the pixels comprises:
    an organic light-emitting device comprising a counter electrode connected to a second power source;
    a first transistor comprising a first electrode connected to one of the data lines and a second electrode connected to a first node, the first transistor to be turned on in response to a scanning signal applied to one of the scanning lines;
    a first capacitor connected between the first node and a third power source and configured to be charged with a voltage corresponding to a data signal applied from the data line; and
    a driving circuit connected to the initialization power line and configured to be charged using a capacitor voltage of the first capacitor and to apply a current corresponding to the capacitor voltage from a first power source to the second power source via an organic light-emitting device.

7. The organic light-emitting display apparatus of claim 6, wherein the third power source is configured to have the same voltage as a voltage of the first power source or the initialization power line.

8. The organic light-emitting display apparatus of claim 6, further comprising:
   a second transistor comprising a first electrode connected to the first node and a second electrode connected to a second node, the second transistor to be turned on prior to the first transistor during a frame period;
   a third transistor comprising a first electrode connected to the initialization power line and a second electrode connected to a third node, the third transistor to be turned on prior to the second transistor during the frame period;
   a fourth transistor comprising a first electrode connected to the third node and a second electrode connected to a fourth node, the fourth transistor to be turned on at the same time as the second transistor;
   a fifth transistor comprising a first electrode connected to the first power source and a second electrode connected to the second node, the fifth transistor to be turned on at the same time as the third transistor;
   a sixth transistor comprising a first electrode connected to the second node, a second electrode is connected to the fourth node, and a gate electrode connected to the third node;
   a seventh transistor comprising a first electrode connected to the fourth node and a second electrode connected to a pixel electrode of the organic light-emitting device, the seventh transistor to be turned on in response to the first transistor being turned on and to stay turned on at least for an emission period;
   an eighth transistor comprising a first electrode connected to the first power source and a second electrode connected to the second node, the eighth transistor to be turned on while the seventh transistor is turned on; and
   a second capacitor comprising a first electrode connected to the third node and a second electrode connected to the first power source.

9. An organic light-emitting display apparatus comprising:
   pixels arranged in a display region of a substrate and at intersections between scanning lines and data lines;
   a first initialization main line arranged along a first side of the display region of the substrate;
   a second initialization main line arranged along a second side of the display region of the substrate;
   an initialization power line electrically connected to the pixels and to the first initialization main line and the second initialization main line; and
   a first electrical connection portion comprising a conductive layer for electrically connecting the first initialization main line to the initialization power line.

10. The organic light-emitting display apparatus of claim 9, wherein each pixel comprises a pixel electrode, a counter electrode opposing the pixel electrode, and an intermediate layer comprising an emission layer disposed between the pixel electrode and the counter electrode, and
   wherein the conductive layer comprises the same material as that of the counter electrode.

11. The organic light-emitting display apparatus of claim 10, further comprising a pixel-definition layer overlying the pixel electrode so as to expose at least part of the pixel electrode,
   wherein the pixel-definition layer overlies the initialization power line and the first initialization main line so as to expose at least part of the first initialization main line and at least part of the initialization power line adjacent a connection point thereof, and
   wherein the conductive layer is in contact with the exposed part of the first initialization main line and the exposed part of the initialization power line.

12. The organic light-emitting display apparatus of claim 9, further comprising a second electrical connection portion comprising a doped semiconductor layer connected to the first electrical connection portion adjacent the initialization power line and the first initialization main line.

13. The organic light-emitting display apparatus of claim 12, wherein each pixel comprises a thin film transistor comprising a semiconductor layer and source and drain electrodes, and
   wherein the doped semiconductor layer is disposed on the same layer as the semiconductor layer.

14. The organic light-emitting display apparatus of claim 13, wherein the initialization power line is disposed on the same layer as the source and drain electrodes and overlies a first insulating layer comprising an opening exposing at least part of the doped semiconductor layer, and
   wherein the initialization power line is connected to the doped semiconductor layer through the opening.

15. The organic light-emitting display apparatus of claim 14, wherein the first initialization main line is disposed on the first insulating layer and is connected to the doped semiconductor layer through the opening.

16. The organic light-emitting display apparatus of claim 12, further comprising:
   a second insulating layer underlying the first insulating layer that underlies the initialization power line; and
   an island insulating layer in an island shape is disposed on at least part of the doped semiconductor layer and exposing sides of the doped semiconductor,
   wherein the island insulating layer comprises the same material as the second insulating layer.

17. The organic light-emitting display apparatus of claim 9, wherein each of the pixels comprises:
   an organic light-emitting device comprising a counter electrode connected to a second power source;
   a first transistor comprising a first electrode connected to one of the data lines and a second electrode connected to a first node, the first transistor to be turned on in response to a scanning signal applied to one of the scanning lines;
   a first capacitor connected between the first node and a third power source and configured to be charged with a voltage corresponding to a data signal applied from the data line; and
   a driving circuit connected to the initialization power line and configured to be charged using a capacitor voltage of the first capacitor and to apply a current corresponding to the capacitor voltage from a first power source to the second power source via an organic light-emitting device.

18. The organic light-emitting display apparatus of claim 17, wherein the third power source is configured to have the same voltage as a voltage of the first power source or the initialization power line.

19. The organic light-emitting display apparatus of claim 17, further comprising:
   a second transistor comprising a first electrode connected to the first node and a second electrode connected to a second node, the second transistor to be turned on prior to the first transistor during a frame period;
   a third transistor comprising a first electrode connected to the initialization power line and a second electrode connected to a third node, the third transistor to be turned on prior to the second transistor during the frame period;

a fourth transistor comprising a first electrode connected to the third node and a second electrode connected to a fourth node, the fourth transistor to be turned on at the same time as the second transistor;

a fifth transistor comprising a first electrode connected to the first power source and a second electrode connected to the second node, the fifth transistor to be turned on at the same time as the third transistor;

a sixth transistor comprising a first electrode connected to the second node, a second electrode is connected to the fourth node, and a gate electrode connected to the third node;

a seventh transistor comprising a first electrode connected to the fourth node and a second electrode connected to a pixel electrode of the organic light-emitting device, the seventh transistor to be turned on in response to the first transistor being turned on and to stay turned on at least for an emission period;

an eighth transistor comprising a first electrode connected to the first power source and a second electrode connected to the second node, the eighth transistor to be turned on while the seventh transistor is turned on; and a second capacitor comprising a first electrode connected to the third node and a second electrode connected to the first power source.

* * * * *